(12) United States Patent
Okino et al.

(10) Patent No.: US 6,541,169 B1
(45) Date of Patent: Apr. 1, 2003

(54) METHODS FOR CHARGED-PARTICLE-BEAM MICROLITHOGRAPHY INCLUDING CORRECTION OF DEFLECTION ABERRATIONS, AND DEVICE-MANUFACTURING METHODS COMPRISING SAME

(75) Inventors: Teruaki Okino, Kamakura (JP); Shinichi Kojima, Tsukuba (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/638,200

(22) Filed: Aug. 11, 2000

(30) Foreign Application Priority Data

Aug. 12, 1999 (JP) .......................................... 11-228557

(51) Int. Cl.⁷ ................................................ G03C 5/00
(52) U.S. Cl. .......................... 430/30; 430/296; 430/942
(58) Field of Search .......................... 430/30, 296, 942

(56) References Cited

U.S. PATENT DOCUMENTS

| 5,879,842 | A | | 3/1999 | Okino | 430/22 |
| 5,942,373 | A | * | 8/1999 | Chou et al. | 430/328 |
| 6,210,846 | B1 | * | 4/2001 | Rangarajan et al. | 430/328 |
| 6,340,556 | B1 | * | 1/2002 | Wong | 430/328 |
| 6,358,670 | B1 | * | 3/2002 | Wong et al. | 430/328 |

* cited by examiner

*Primary Examiner*—Christopher G. Young
(74) *Attorney, Agent, or Firm*—Klarquist Sparkman LLP (57) ABSTRACT

Methods and apparatus are provided for performing charged-particle-beam microlithography at improved accuracy. A pattern is formed on a substrate (wafer) by repeated shot exposure of respective areas on a wafer substrate mounted on a wafer stage. Exposure of the wafer is made while the wafer stage is undergoing continuous motion and the charged particle beam making the exposure is being deflected continuously. As the magnitude of the beam deflection changes according to the motion of the stage, correction data for deflecting the beam are updated appropriately so as to correct deflection aberrations continuously.

33 Claims, 6 Drawing Sheets

METHODS FOR CHARGED-PARTICLE-BEAM MICROLITHOGRAPHY INCLUDING CORRECTION OF DEFLECTION ABERRATIONS, AND DEVICE-MANUFACTURING METHODS COMPRISING SAME

FIELD OF THE INVENTION

This invention pertains to microlithography, which is a key technology used in the manufacture of semiconductor integrated circuits, displays, and the like. More specifically, this invention pertains to microlithography performed using a charged particle beam such as an electron beam or ion beam.

BACKGROUND OF THE INVENTION

The following discussion of conventional microlithography is set forth in the context of using an electron beam as a representative charged particle beam.

Pattern transfer using electron-beam drawing is highly precise, but has the fault of low throughput. Considerable research effort has been expended in investigating various technical approaches to improving throughput. These approaches include partial-pattern, single-shot exposure techniques referred to as cell projection, character projection, or block exposure.

In partial-pattern, single-shot techniques, certain repetitive portions of the circuit defined on a reticle are exposed many times onto respective regions of a die on the wafer (typically, these repetitive regions measure approximately 5 $\mu$m-square on the wafer). Each different repetitive portion is defined by at least one respective region on the reticle. This technique is used especially whenever the reticle pattern has large numbers of identical features having the same configuration, such as in a memory chip. Unfortunately, certain portions of the circuit that are not repeated must be transferred to the wafer using another technique, such as a variable-shaped-beam technique. Having to employ two or more different microlithography techniques to expose each die on the wafer results in a throughput that often is too low for use in mass production of wafers. Also, the throughput obtainable using the variable-shaped-beam technique is low.

To improve throughput, electron-beam reduction-transfer microlithography techniques have been devised. In certain apparatus employing such a technique, the reticle has a field defining the pattern for an entire die to be transferred to the wafer. The reticle field is illuminated using an electron irradiation beam, and an image of the illuminated field is "reduced" (demagnified) and transferred onto the wafer by a projection-optical system. Whereas this full-field transfer technique offers prospects of vastly higher throughput than partial-pattern single-shot techniques, aberrations over a large field currently cannot be controlled satisfactorily to achieve the desired resolution. Also, reticles suitable for transferring an entire field in one shot are extremely difficult to fabricate.

In view of the above, electron-beam microlithography techniques currently receiving the most attention are those in which the reticle pattern is divided into a large number of field portions, termed "subfields," that are exposed individually and sequentially onto the wafer by the electron beam. Such techniques are termed "divided-reticle" microlithography methods. The subfields are exposed and transferred using a projection-optical system having a large optical field. Each subfield is exposed using a respective "shot." To expose a subfield, the illumination beam is directed to the desired subfield so as to transfer an image of the subfield to a respective position on the wafer. As the subfield is being exposed, aberrations such as image defocusing and field distortion can be corrected in real time. On the wafer, the images of individual subfields are situated such that they are "stitched together" (placed contiguously relative to each other) to form the complete pattern. Divided-reticle exposure achieves better resolution and transfer accuracy over a wider optical field than achievable using a single-shot transfer of an entire die. Exploiting the wide exposure field in a divided-reticle exposure apparatus, high throughput can be achieved by continuously moving the respective stages on which the reticle and wafer are mounted.

In a cell-projection apparatus, the reticle is stationary during exposure, but the wafer is moved continuously. Under such conditions, the reticle image must be displaced smoothly using a deflector so that the reticle image tracks the motion of the wafer. Whenever an image is displaced using a deflector, the magnitude of beam deflection correspondingly changes, which causes continuous changes in the magnitude of deflection distortion. Heretofore, this change in deflection distortion was relatively slight and exhibited virtually no effect on exposure-position errors and image-defocusing. As a result, the amount of correction applied to correct deflection distortion was not revised (updated) continuously according to changes in the magnitude of deflection.

However, recent R&D has been aimed at expanding the deflection range and increasing the velocity of stage motion so as to further increase throughput. Deflection distortion generally is proportional to the cube of the corresponding magnitude of beam deflection. Consequently, as the magnitude of beam deflection increases, the magnitude of change in deflection distortion during a shot can reach a level that no longer can be ignored. Also, as circuit patterns continue to increase in density and complexity, the required tolerances for exposure accuracy and image defocusing become increasingly stringent. Therefore, it now is necessary to consider changes in aberrations, previously regarded as negligible, that accompany changes in the deflection magnitude during each shot.

In divided-reticle microlithography apparatus, the respective image of each illuminated subfield of the reticle typically is reduced (demagnified) as projected onto the wafer. Projection typically is performed using symmetrical magnetic doublet (SMD) electron-lens systems. Projection and exposure are performed while continuously and synchronously moving the reticle stage and the wafer stage. Demagnification is according to a "demagnification ratio," which is a factor by which an image as formed on the wafer is smaller than the corresponding region on the reticle. During exposure, the velocity of the wafer stage to the velocity of the reticle stage nominally is equal (but see below) to the demagnification ratio of the projection-optical system. Even under such conditions, the magnitude of deflection of the reticle image relative to the projection-optical system will change during each shot. I.e., the trajectory of the imaging beam from the illuminated region of the reticle to the imaging position on the wafer changes during each shot.

In actual practice, in a divided reticle, individual subfields typically are separated from one another by struts. The struts provide substantial rigidity and mechanical strength to the reticle, and serve to conduct heat away from the reticle during illumination of the reticle. The struts normally are configured in a grid pattern, with individual subfields being located in respective spaces between adjacent struts. These aspects will be described later below with reference to FIGS. 2(A)–2(C). Respective images of the struts are not projected onto the wafer. Consequently, the ratio of movement velocity of the substrate to the movement velocity of the reticle is not exactly equal to the demagnification ratio. I.e., the reticle moves slightly faster than indicated by the ratio, as described below with reference to FIG. 3.

Because of the higher velocity of the reticle during exposure, it is necessary to change the position of the projected image as "seen" from the projection-optical system during each shot. In other words, it is necessary to continuously change the magnitude of positional change from the viewpoint of the optical-lens column (i.e., the amount of movement in the image point due to movement of the object point of the projection lens), as well as to continuously change the magnitude of beam deflection to compensate for the velocity differential.

Ideal positioning of the reticle stage, on which the reticle is mounted, is not limited to microlithographic exposure systems that transfer a continuously moving reticle. In conventional scanning optical steppers, the reticle stage has a two-tier structure, in which a fine-movement stage (configured to move within a small but highly accurate range) is situated atop a high-speed stage (configured to move at high velocity over a wide range). The positional accuracy of the high-speed stage is relatively "coarse," but any positional error of the high-speed stage is compensated for by the fine-movement stage. Unfortunately, the two-tier reticle-stage configuration is costly, and also results in excessive overall thickness of the reticle stage.

Wafer stages having a two-tier configuration also have the same disadvantages.

SUMMARY OF THE INVENTION

In view of the shortcomings of the prior art as summarized above, an object of the invention is to provide charged-particle-beam (CPB) exposure apparatus and methods providing improved accuracy of pattern transfer.

To such end, and according to a first aspect of the invention, methods are provided for performing a microlithographic transfer of a pattern onto a sensitive exposure surface of a substrate using a charged particle beam. In one embodiment of such methods, the substrate (mounted on a substrate stage) is exposed with multiple successive shots of a charged-particle patterned beam onto respective specific locations on the exposure surface while moving the substrate stage and deflecting the patterned beam to the respective specific locations. Thus, the exposure surface is imprinted with the pattern. Meanwhile, during the shots, respective amounts of aberration correction are applied (typically by deflecting the patterned beam) as the patterned beam is deflected to the respective specific locations. In a given shot in which deflection of the patterned beam has changed from a previous position, the amount of the correction is updated so as to apply an appropriate aberration correction for the given shot. The amount of aberration correction applied in a shot typically corresponds to the respective specific location of the patterned beam. The aberration correction is directed to one or more aberrations such as deflection-position distortion, defocusing, astigmatism, image rotation, image magnification shift, and image astigmatic distortion. For example, deflection-position distortion can be corrected using a deflector; defocusing, image magnification shift, and image rotation can be corrected using a focusing coil; and astigmatism and astigmatic distortion can be corrected using a stigmator or astigmatic corrector.

In another method embodiment, the illumination beam is deflected to an irradiation area of the reticle so as to illuminate a respective pattern portion in the irradiation area. The patterned beam is projected and deflected to a respective location on the exposure surface so as to form an image at the location of the respective pattern portion illuminated in the irradiation area. These steps are repeated as required to perform, by multiple successive shots, transfer of images of respective pattern portions (illuminated in respective irradiation areas) to respective locations on the exposure surface. As in the first embodiment, during the shots, respective amounts of aberration correction are applied (typically by deflecting the patterned beam) as the patterned beam is deflected to the respective specific locations. Accompanying progression to a given shot, the amount of aberration correction is updated so as to apply an appropriate aberration correction for the given shot.

In another method embodiment, the substrate is mounted on a movable substrate stage and the reticle is mounted on a movable reticle stage. During exposure, the reticle stage is moved at a reticle-stage velocity while the illumination beam is deflected to an irradiation area on the reticle so as to illuminate a respective pattern portion in the irradiation area. Meanwhile, the substrate stage is moved at a substrate-stage velocity while the patterned beam is projected to a respective location on the exposure surface so as to form at the location a demagnified image of the respective pattern portion illuminated in the irradiation area. These steps are repeated as required to perform, by multiple successive shots, transfer of images of respective pattern portions in respective irradiation areas, to respective locations on the exposure surface so as to stitch the images together and transfer the pattern to the exposure surface. If, during any of these exposures, the demagnification ratio of an image as projected onto a respective location on the exposure surface does not match a ratio of the substrate-stage velocity to the reticle-stage velocity, then the image is caused to track movement of the respective location on the exposure surface by appropriately deflecting the patterned beam. During the shots, as the patterned beam is deflected, respective amounts of aberration correction are applied (e.g., by deflection) to the patterned beam. Accompanying progression to a given shot, if the required amount of aberration correction has changed, then the amount of correction is updated so as to apply an appropriate aberration correction for the given shot.

In yet another method embodiment, the substrate and reticle are mounted on respective movable stages. The reticle stage is moved while directing an illumination beam to an irradiation area on the reticle so as to illuminate a respective pattern portion in the irradiation area. Meanwhile, the substrate stage is moved while projecting the patterned beam to a respective location on the exposure surface so as to form at the location a demagnified image of the respective pattern portion illuminated in the irradiation area. These steps are repeated as required to perform, by multiple successive shots, transfer of images of respective pattern portions in respective irradiation areas to respective locations on the exposure surface. While making the exposures, a deflection is imparted to the illumination beam (e.g., by a deflector located in the illumination-optical system) as required to correct an error in irradiation position of the illumination beam on the reticle relative to an ideal position of the irradiation area on the reticle. Also, a deflection is imparted (e.g., by a deflector located in the projection-optical system) to the patterned beam as required to correct an error in the location of an image, as projected onto the exposure surface, of a respective pattern portion (illuminated in the respective irradiation area) caused by a reticle-position error. This method can include one or more of the following steps: (a) correcting a deflection distortion arising from use of the illumination-beam deflector to deflect the illumination beam to correct a deviation of the reticle from an ideal reticle position, and (b) correcting a deflection distortion arising from use of the patterned-beam deflector to deflect the patterned beam to correct a position error of the projected image on the exposure surface as caused by a reticle-position error.

In this embodiment, whenever the reticle position has shifted from its ideal position as a result of the reticle stage not being positioned ideally, the illumination position can be corrected using an illumination-beam deflector so that the center of the illumination beam desirably is positioned substantially at the center of the exposure field of the reticle. If necessary or desired, deflection distortion imparted by the deflector used to move the illumination beam also can be corrected at this time. Thus, the exposure field on the reticle can be illuminated properly.

In addition, whenever the reticle position has shifted from its ideal position, the transfer position of the reticle image on the exposure surface also is shifted. This shift can be corrected by a deflector desirably disposed between the reticle and the substrate. If necessary or desired, correction of any deflection distortion imparted by this deflector can be made at this time. Thus, transfer and exposure can be performed at the correct location on the substrate even if the reticle position has shifted.

Furthermore, if the substrate has shifted from its ideal position, the transfer position on the exposure surface can be corrected by a deflector located between the reticle and the wafer. If necessary, correction can include correcting a deflection distortion imparted to the patterned beam by this deflector. Thus, transfer and exposure can be performed at the correct location on the substrate, even if the position of the substrate has shifted.

Only deflection distortion has been mentioned in the foregoing summary of this embodiment. Magnitudes of deflection can differ from corresponding ideal magnitudes as a result of either or both the reticle and substrate shifting from their respective ideal positions. Aberrations other than deflection distortion can arise from these positional differences or from differences in deflection magnitude (e.g., one or more of focus, astigmatism, image rotation, image-magnification shift, and image-astigmatic distortion). These aberrations can be corrected as necessary or desired using a deflector, a focus compensator, a stigmator, a rotation-correction coil, a magnification-correction coil, or the like.

In yet another method embodiment, the pattern on the reticle is defined in a manner in which the pattern is divided into multiple respective pattern segments. The substrate and reticle are mounted on respective movable stages. The illumination beam is provided with a transverse-profile area that is smaller than a pattern segment. While moving the reticle stage, the illumination beam is deflected in a scanning manner onto an irradiation area of the reticle so as to illuminate a respective pattern portion in the irradiation area. Meanwhile, while moving the substrate stage, the patterned beam is projected in a scanning manner to a respective location on the exposure surface so as to form at the location a demagnified image of the respective pattern portion illuminated in the irradiation area. These steps are repeated as required to perform, by multiple successive shots made by scanning the illumination and patterned beams, transfer of images of respective pattern portions in respective irradiation areas to respective locations on the exposure surface. During the shots, respective amounts of aberration correction are applied as the patterned beam is deflected to the respective specific locations. Accompanying progression to a given shot, the amount of aberration correction is updated as required so as to apply an appropriate aberration correction for the given shot.

In yet another method embodiment, the substrate and reticle are mounted on respective movable stages. While moving the reticle stage, the illumination beam is deflected to an irradiation area of the reticle so as to illuminate a respective pattern portion in the irradiation area. Meanwhile, while moving the substrate stage, the patterned beam is deflected and projected to a respective location on the exposure surface so as to form at the location a demagnified image of the respective pattern portion illuminated in the irradiation area. These steps are repeated as required to perform, by multiple successive shots, transfer of images of respective pattern portions to respective locations on the exposure surface. During a shot, the patterned beam is deflected in a manner by which the image of the respective pattern portion in the illuminated irradiation area tracks movement of the respective imaging location on the exposure surface. Also, during a shot, an amount of aberration correction is applied as the patterned beam is deflected to the respective specific locations. Accompanying progression to a given shot, the amount of aberration correction is updated as required so as to apply an appropriate aberration correction for the given shot. For the given shot, if a position of the reticle is not an ideal reticle position and a corresponding position of the substrate is not an ideal substrate position, then the patterned beam can be deflected further (e.g., using a deflector in the projection-optical system) to apply respective corrections to the reticle position and substrate position and to correct any deflection distortions of the patterned beam, so as to form the respective image at an ideal location on the exposure surface.

This embodiment combines the steps of correcting aberration changes that accompany changes in deflection during a shot and correcting aberrations arising from differences in deflection accompanying deviations from the ideal reticle and/or substrate positions.

According to another aspect of the invention, charged-particle-beam microlithography apparatus are provide for transferring a pattern to a sensitive exposure surface of a substrate. One embodiment of such an apparatus comprises a movable substrate stage for mounting the substrate for exposure. An illumination-optical system is situated and configured to direct an illumination beam to an irradiation area on the reticle. A projection-optical system is situated and configured to direct a patterned beam to a respective location on the exposure surface so as to form an image at the location of the respective pattern portion in the illuminated irradiation area. The apparatus also includes a central controller that is connected to the substrate stage, the illumination-optical system, and the projection-optical system. The central controller is configured to: (1) coordinate movements of the substrate stage and respective operations of the illumination-optical system and projection-optical system to expose the substrate with multiple successive shots of the patterned beam deflected onto respective locations on the exposure surface, so as to imprint the exposure surface with the pattern; (2) during a shot, apply an amount of aberration correction as the patterned beam is deflected to the respective locations; and (3) update the amount of the correction in a given shot in which deflection of the patterned beam has changed from a previous shot, so as to apply an appropriate aberration correction for the given shot.

In another embodiment of an apparatus according to the invention, the reticle and substrate are mounted on respective movable stages. The apparatus includes an illumination-optical system and projection-optical system as summarized above. The central controller, connected to the stages and the optical systems, is configured to: (1) coordinate respective movements of the stages and respective operations of the illumination-optical system and projection-optical system to expose the substrate with multiple successive shots of the patterned beam deflected onto respective locations on the exposure surface, so as to imprint the exposure surface with a stitched-together image of the pattern; (2) during a shot, apply an amount of aberration correction; and (3) if a required amount of aberration correction has changed with progression to a given shot, then update the amount of aberration correction so as to apply an appropriate aberration correction for the given shot.

Yet another apparatus embodiment includes stages and optical systems as summarized above, as well as a central controller configured to coordinate respective movements of the stages at respective stage velocities and respective operations of the illumination-optical system and projection-optical system to expose the substrate with multiple successive shots of the patterned beam deflected onto respective locations on the exposure surface, so as to imprint the exposure surface with a reduced, stitched-together image of the pattern. In a shot, depending upon the demagnification ratio of an image of the respective pattern portion (in the irradiation area), as projected onto the respective location on the exposure surface, the central controller causes the image of the respective pattern portion to track movement of the respective location on the exposure surface by appropriately deflecting the patterned beam. The central controller also applies respective amounts of aberration correction as the patterned beam is deflected to the respective specific locations. If a required amount of aberration correction has changed with progression to a given shot, then the central controller updates the amount of aberration correction so as to apply an appropriate aberration correction for the given shot.

In this embodiment, the pattern field of the reticle is divided into multiple small fields (e.g., subfields), and struts extend between the small fields to provide mechanical strength and rigidity to the reticle. The reticle stage and substrate stage typically are moved so that their respective stripe-exposure start points and stripe-exposure end points are synchronized with each other. For example, if the ratio of the movement velocity of the exposure surface relative to the movement velocity of the reticle does not match the demagnification ratio at which the reticle is imaged onto the exposure surface, then the patterned beam is deflected (desirably using a deflector included inside a projection lens) during exposure. Thus, the projected image is caused to track the motion of the corresponding region of the exposure surface.

Yet another apparatus embodiment comprises stages and optical systems as summarized above. Also, a central controller is provided that is configured to coordinate respective movements of the stages at respective stage velocities and to coordinate respective operations of the illumination-optical system and projection-optical system to expose the substrate with multiple successive shots of the patterned beam deflected onto respective locations on the exposure surface, so as to imprint the exposure surface with a reduced, stitched-together image of the pattern. In a shot, the central controller detects an error in irradiation position of the illumination beam on the reticle relative to an ideal position of the irradiation beam on the reticle, and deflects the illumination beam as required to correct the error. In the shot, the central controller also predicts an error in the location of an image, as projected onto the exposure surface, of the respective portion of the pattern illuminated in the irradiation area caused by the error in reticle position, and deflects the patterned beam as required to correct the error. The central controller can be configured further to (a) apply an amount of aberration correction as the patterned beam is deflected to the respective specific locations; and (b) if a required amount of aberration correction has changed with progression to a given shot, then update the amount of aberration correction so as to apply an appropriate aberration correction for the given shot.

Yet another apparatus embodiment includes stages and optical systems as summarized above. The apparatus utilizes a reticle in which the pattern is divided into multiple respective pattern segments. The illumination beam has a transverse-profile area that is smaller than a pattern segment. The apparatus also includes a central controller configured to: (1) coordinate respective movements of the stages at respective stage velocities and respective operations of the illumination-optical system and projection-optical system to expose the substrate with multiple successive scanned shots of the patterned beam deflected onto respective locations on the exposure surface, so as to imprint the exposure surface with a reduced, stitched-together image of the pattern; (2) apply an amount of aberration correction as the patterned beam is deflected in a scanning manner to the respective specific locations; and (3) if a required amount of aberration correction has changed with progression to a given shot, then update the amount of aberration correction so as to apply an appropriate aberration correction for the given shot.

Yet another apparatus embodiment includes stages and optical systems as summarized above. The apparatus also includes a central controller configured to coordinate respective movements of the stages at respective stage velocities, and to coordinate respective operations of the illumination-optical system and projection-optical system to expose the substrate with multiple successive shots of the patterned beam deflected onto respective locations on the exposure surface, so as to imprint the exposure surface with a reduced, stitched-together image of the pattern. In a shot, the central controller deflects the patterned beam to cause the respective image of the respective pattern portion illuminated in the respective irradiation area to track movement of the respective location on the exposure surface. The central controller also applies an amount of aberration correction as the patterned beam is deflected to the respective specific locations. If a required amount of aberration correction has changed with progression to a given shot, then the central controller updates the amount of aberration correction so as to apply an appropriate aberration correction for the given shot. For the given shot, the central controller further deflects the patterned beam if a position of the reticle is not an ideal reticle position and a corresponding position of the substrate is not an ideal substrate position, so as to apply respective corrections to the reticle position and substrate position, correct any deflection distortions of the patterned beam, and form the respective image at an ideal location on the exposure surface.

Yet another apparatus embodiment comprises a movable reticle stage on which a divided reticle is mounted for exposure. An illumination-optical system is situated and configured to irradiate an irradiation area, including a respective partial field of a reticle pattern, of the reticle with a charged-particle illumination beam. The substrate is mounted on a movable substrate stage for exposure. A projection-optical system is situated and configured to a direct and focus a charged-particle patterned beam, propagating downstream of the irradiation area on the reticle, to a respective location on the exposure surface, to form an image at the respective location of the respective partial field illuminated in the irradiation area. The projection-optical system comprises deflection-aberration-correction means, which comprises means for applying a correction to a continuously changing aberration produced from corresponding changes in a patterned-beam trajectory within the projection-optical system during exposure of the irradiation areas. The aberration-correction means also includes means for changing an amount of the correction as required or desired to update the correction as exposure proceeds.

The reticle used with this embodiment typically is divided into multiple small fields ("partial fields" such as subfields), usually separated by struts. Groups of small fields are arrayed into stripes. During exposure, the reticle stage and substrate stage are moved so that their stripe-exposure start points and stripe-exposure end points are synchronized with each other. A deflector (desirably located inside a projection lens) is configured to cause the projected image of a small field to track the movement of the corresponding region on the exposure surface. Alternatively to step-wise exposure of the small fields, exposure can be performed by deflecting and scanning the illumination beam (desirably having a transverse dimension that is smaller than the scanned small field). Thus, a corresponding area on the exposure surface is exposed (by scanning the patterned beam) that corresponds with the small field. The dimensions of the small field are configured to allow such deflection-scanning of the illumination beam. For example, the horizontal width of the small field corresponds to a direction perpendicular to the stage-scanning direction. The small field has a horizontal width corresponding to the deflection width of the beam. As a result, an entire small field can be illuminated by deflecting and scanning the illumination beam parallel to the horizontal width of the small field. At the exposure surface, the patterned beam is scanned in a direction perpendicular to the direction of continuous movement of the substrate stage. Meanwhile, the patterned beam is deflected in the direction of continuous movement of the stage using a deflector (desirably disposed inside a projection lens).

In this embodiment, changes in aberrations (e.g., distortion) that change during a shot are corrected. Aberrations other than deflection distortion include one or more of focus, astigmatism, image rotation, image-magnification shift, and image defocusing. These aberrations can be corrected using a deflector, a focus compensator, a stigmator, a rotation-correction coil, a magnification-correction coil, an image-defocusing coil, etc.

Corrections during a shot can be made in various ways. One way is to impose beam blanking while the correction values are being modified, then canceling beam blanking after the output of a compensator (e.g., deflector) performing the corrections has stabilized. Another way is to smooth the output of the correcting compensator (e.g., deflector) and make corrections at the location of beam emission. For example, the beam-projection position is corrected by appropriately updating a distortion-correction value. Whenever such correction-value updating is not performed, the image-projection position may change slightly during the shot. This causes image-defocusing and deterioration of the projection position. This embodiment corrects these problems.

The foregoing and additional features and advantages of the invention will be more apparent from the following detailed description, which proceeds with reference to the accompanying drawings.

BRIEF DESCRIPTION OF THE DRAWINGS

FIGS. 2(A)–2(C) schematically depict various details of a segmented reticle that can be used in the FIG. 1 embodiment.

DETAILED DESCRIPTION

Figure 1:
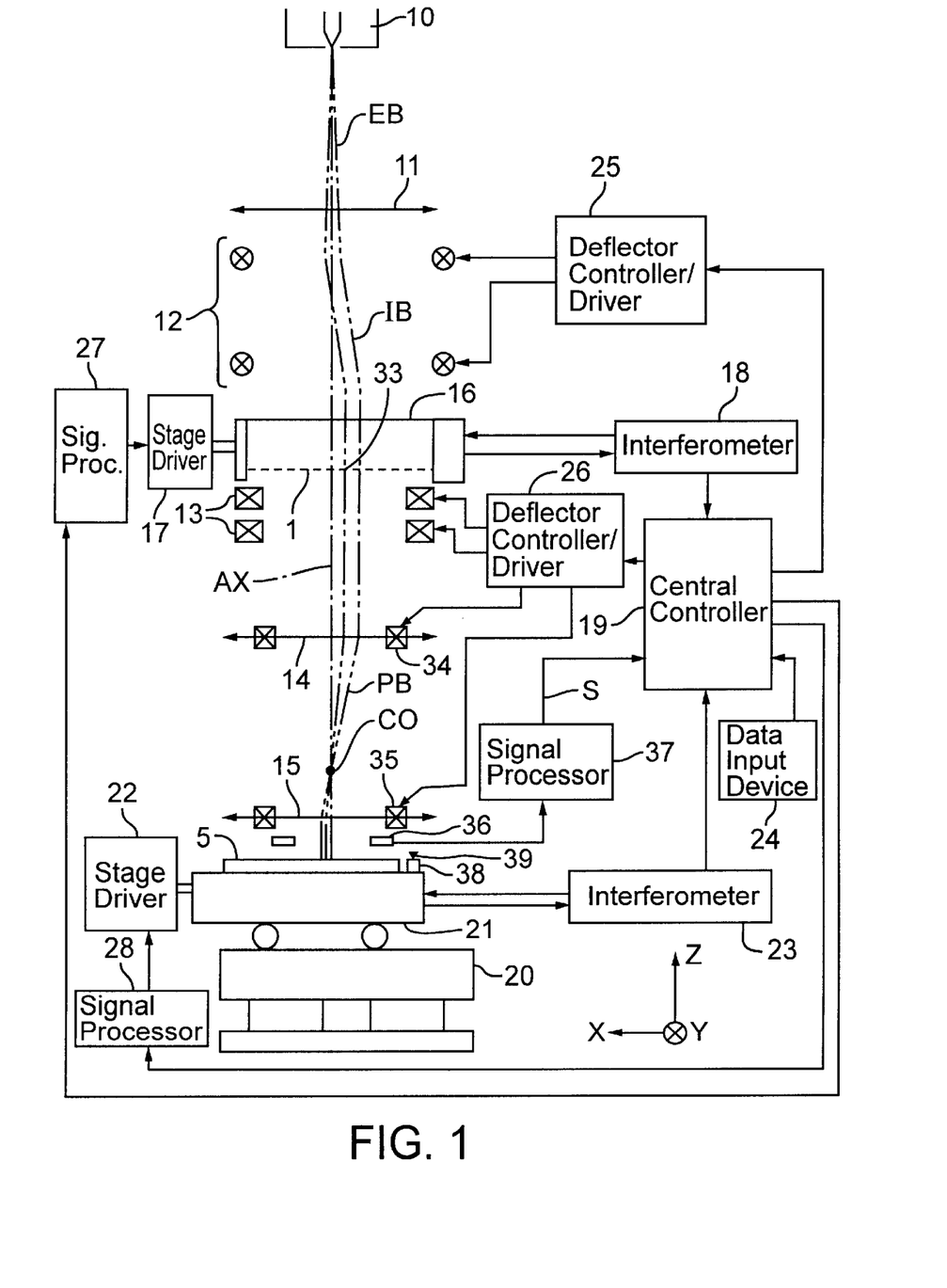
FIG. 1 schematically depicts, in block-diagram form, a representative embodiment of an electron-beam (as an exemplary charged particle beam) microlithography apparatus according to the invention.

An overall configuration of a charged-particle-beam microlithography apparatus according to a representative embodiment is shown in FIG. 1. The FIG. 1 apparatus is described below in the context of an electron-beam system; however, it will be understood that the general principles described herein can be applied with equal facility to other CPB systems, such as an ion-beam system.

In FIG. 1, the Z-axis extends parallel to the optical axis AX of the electron-optical system. The X-axis is perpendicular to the Z-axis, and the X- and Z-axes define the plane of the page. The Y-axis extends perpendicularly to the plane of the page.

The FIG. 1 apparatus comprises an electron gun 10 that produces an electron beam EB propagating along the axis AX. The electron beam EB propagates through an "illumination-optical system" from the electron gun 10 to a reticle 1, and through a "projection-optical system" from the reticle 1 to a substrate (wafer) 5.

The illumination-optical system comprises a condenser lens 11 and a field-selection deflector 12. Passage of the electron beam EB through the condenser lens 11 collimates the beam. The field-selection deflector 12 is connected to a central controller 19 via a deflector controller/driver 25. The central controller 19, configured to perform general overall controlled operation of the FIG. 1 apparatus, determines and sets the magnitude and angle of deflection imposed by the field-selection deflector 12 on the beam EB. In the figure, the field-selection deflector 12 deflects the beam EB primarily in the X-direction within the X-Y plane. The field-selection deflector 12 desirably comprises a two-stage electromagnetic deflector or electrostatic deflector. From the field-selection deflector 12, the electron beam EB propagates to an irradiation area 33 on the reticle 1. The irradiation area 33 typically covers a small portion of the overall pattern defined by the reticle 1, and is the respective area of the reticle irradiated by the illumination beam at any instant.

The beam EB propagating between the electron gun 10 and the reticle 1 is termed herein the "illumination beam" IB, which propagates from the electron gun 10 through the illumination-optical system to the reticle 1. The beam EB propagating between the reticle 1 and the wafer 5 is termed the "patterned beam" PB which propagates through the projection-optical system.

The projection-optical system in FIG. 1 comprises a two-stage deflector 13, a first projection lens 14, and a second projection lens 15. The deflector 13 is connected to the central controller 19 by a deflector controller/driver 26. Under control of the central controller 19, the deflector 13 subjects the patterned beam PB to a specified magnitude and direction of deflection. Passage of the patterned beam PB through the projection lenses 14 and 15 causes the patterned beam to form an image, of the respective pattern portion in the irradiation area 33, on the wafer 5. A crossover C.O. is formed at the indicated location.

Typically, the first and second projection lenses 14, 15 collectively form a symmetric magnetic doublet (SMD) lens system. The SMD lens system has a specified demagnification ratio (e.g., ¼, by which is meant that the image, as formed on the wafer 5, of a respective pattern portion in an irradiation area as formed on the wafer 5 is ¼ the size of the actual pattern portion on the reticle).

In a divided-reticle microlithography system as shown in FIG. 1, the reticle typically is divided into "subfields." In one exemplary reticle configuration, each subfield on the reticle 1 is situated between respective adjacent non-patterned regions that are not projected onto the wafer 5. In any event, as formed on the wafer 5, the images of individual subfields are situated (without intervening non-patterned regions) contiguously relative to each other (i.e., the subfield images are "stitched together"). To achieve the accurate placement required for proper stitching together of subfield images, the deflector 13 (under control of the central controller 19) normally shifts the patterned beam PB laterally a distance corresponding to the width of a non-patterned region. Alternatively or in addition, the deflector 13 is energized in a controlled manner to correct synchronization errors between the movements of the reticle 1 and wafer 5 and/or to correct deflection-position distortions, etc. To such end, the deflector can comprise individual electromagnetic deflectors, individual electrostatic deflectors, or a deflector assembly that combines one or more electromagnetic deflectors and one or more electrostatic deflectors.

The first and second projection lenses 14, 15, respectively, include respective corrective deflectors 34, 35. The corrective deflectors 34, 35 are disposed within the inside diameters of the respective lenses 14, 15, and are used to correct deflection-position errors in the projected images. The deflector controller/driver 26, under control of the central controller 19, applies appropriate electrical energy to the corrective deflectors 34, 35 to achieve the desired magnitude and direction of the respective deflections. Each of the corrective deflectors 34, 35 can comprise an electrical coil having a wound hollow-core configuration.

Situated between the second projection lens 15 and the wafer 5 is a backscattered-electron (BSE) detector 36, which is used to detect electrons backscattered from the wafer 5.

The BSE detector 36 is connected via a signal processor 37 to the central controller 19. An output signal from the BSE detector 36 is processed by the signal processor 37 to produce a BSE signal S. The BSE signal S thus is routed to the central controller 19, which processes and utilizes the BSE signal S to detect, for example, respective positions of rotational-angle-measurement marks and registration-measurement marks on the wafer or wafer stage 21.

The reticle 1 is mounted on a reticle stage 16. The reticle stage 16 is connected to a respective stage driver 17. The driver 17 moves the reticle stage 16 continuously in the Y-axis direction and in a step-wise manner in the X-axis direction. The X-coordinate position of the reticle stage 16 is detected by a respective laser interferometer 18 that produces and routes respective electrical signals to the central controller 19. The Y-coordinate position of the reticle stage 16 is detected by a respective laser interferometer (not shown) that also produces and routes respective electrical signals to the central controller 19.

The wafer 5, having an upstream-facing surface coated with a suitable resist, is mounted on the wafer stage 21 that is movable relative to a stage base 20. Movement of the wafer stage 21 is actuated by a respective stage driver 22. The direction of continuous movement of the wafer stage 21 normally is opposite the continuous-movement direction (along the Y-axis) of the reticle stage 16 (whenever the projection lenses 14, 15 constitute an SMD lens system). Under such conditions, the continuous stage movements are in opposite directions because the image as formed by the SMD lens system on the wafer 5 is inverted relative to the object on the reticle 1. The X-coordinate position of the wafer stage 21 is detected by a respective laser interferometer 23 that produces and routes respective electrical signals to the central controller 19. The Y-coordinate position of the wafer stage 21 is measured by a respective laser interferometer (not shown) that also produces and routes respective electrical signals to the central controller 19. The stage drivers 17, 22 are connected to the central controller 19 via respective signal processors 27, 28.

The central controller 19 is connected to a data-input device 24. According to data input from, inter alia, the device 24 and on positional data provided for the stages 16, 21 from the respective laser interferometers, the central controller 19 calculates the magnitude and direction of deflection to be imparted to the electron beam EB by the field-selection deflector 12 and the deflector 13. The central controller 19 also calculates data necessary to control operation of the reticle stage 16 and wafer stage 21 (e.g., the respective positions and movement velocities of the stages).

The results of calculating the deflections are output to the deflector controller/drivers 25, 26, which set the corresponding magnifications and directions of deflection to be imposed on the electron beam EB by the field-selection deflector 12, the deflector 13, and the corrective deflectors 34, 35. Calculation results, from the central controller 19, relating to operation of the stages 16, 21 are output to the respective signal processors 27, 28 that control actuations of the respective stage drivers 17, 22. Thus, the stages 16, 21 are operated in accordance with the calculation results to provide, inter alia, positional corrections.

The data-input device 24 can be configured to read magnetically recorded data produced by an extraneous exposure-data processor. Alternatively or in addition, the data-input device 24 can be configured to read exposure information encoded on the reticle 1 and/or wafer 5 at time of loading onto the respective stages 16, 21.

Thus, the central controller 19 provides appropriate data to each component connected to it so as to cause the respective components to operate in a manner serving to correct positional errors arising from beam deflection, using the deflector controller/driver 26 and correction deflectors 34, 35. These corrections desirably are calculated and made continuously as exposure progresses. Further desirably, these corrections are made in real time.

Other aspects of operation of the FIG. 1 apparatus are as follows.

The illumination beam IB emitted from the electron gun 10 is shaped (so as to have, e.g., a square transverse section) appropriately by a beam-shaping aperture (not shown). The shaped beam is deflected laterally by the field-selection deflector 12 a specified distance from the optical axis AX so as to irradiate a desired irradiation area 33 (including a specific subfield 42 in FIGS. 2(B), 2(C), and 3) on the reticle 1. As the selected irradiation area 33 is illuminated by the illumination beam IB, an image of the respective pattern portion in the irradiation field is projected downstream of the reticle 1 by the patterned beam PB. The image is formed, at the specified demagnification ratio (e.g., ¼ or ⅕), onto a corresponding region ("transfer subfield" 52, FIG. 3) of the wafer 5 by the projection lenses 14, 15. As projection of the reticle pattern progresses, the illumination beam IB sequentially illuminates other subfields of the reticle 1 so as to project images of the respective pattern portions (defined by the subfields) in a sequential manner onto respective transfer subfields 52 on the wafer 5.

Figure 2A:
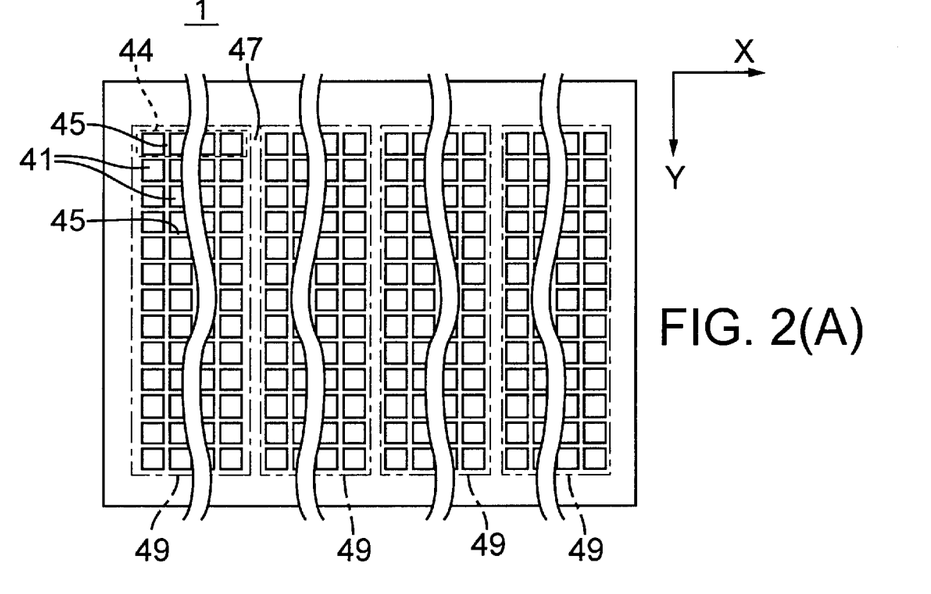
FIG. 2(A) is an overall plan view of the reticle.
Figure 2B:
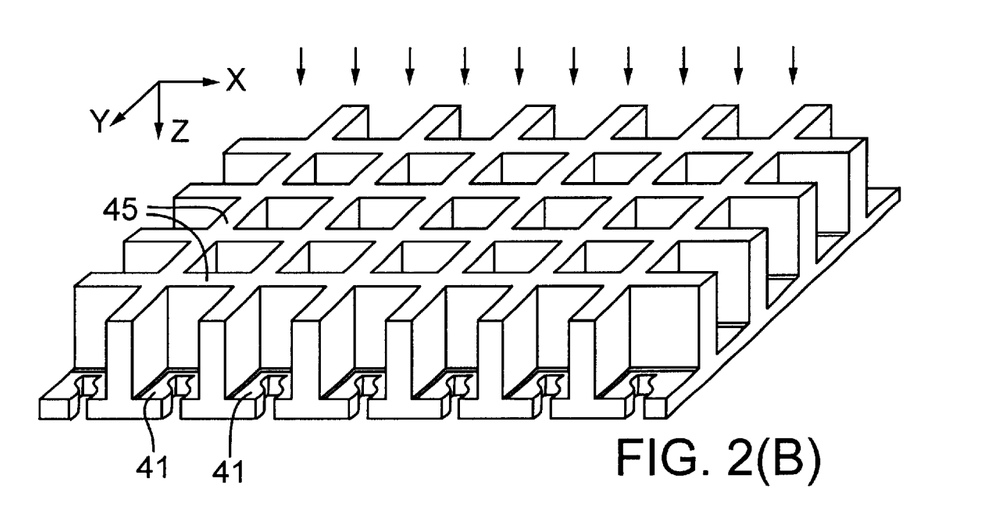
FIG. 2(B) is an oblique view of a portion of the reticle.
Figure 2C:
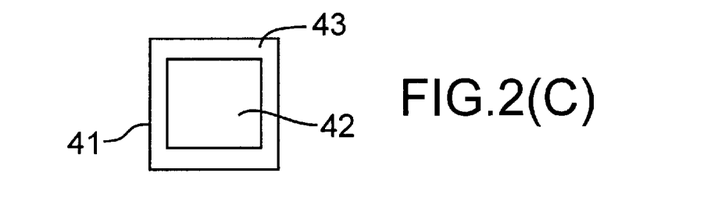
FIG. 2(C) is a plan view of a single membrane region.

Details of a representative divided reticle 1 are shown in FIGS. 2(A)–2(C). FIG. 2(A) is a schematic plan view of the reticle; FIG. 2(B) is a schematic oblique view of a portion of the reticle; and FIG. 2(C) is a schematic plan view showing a single subfield. The depicted reticle can be fabricated, for example, by electron-beam drawing followed by etching of a silicon wafer.

Referring to FIG. 2(A), the individual regions denoted by the numeral 41 are respective membrane regions (0.1 $\mu$m to several $\mu$m thick) corresponding to individual respective subfields. As shown in FIG. 2(C), a typical membrane region 41 comprises a centrally located subfield 42 surrounded by a non-patterned peripheral "skirt" 43. The subfield 42 defines the respective pattern portion. The skirt 43 is a region, surrounding the subfield 42, in which the edges of the illumination beam 2 are incident.

Typically, a single subfield 42 has a size of 0.5-mm square to 5-mm square at the reticle. At a demagnification ratio of ⅕, for example, the corresponding size of an image of a subfield 42 as projected onto the wafer 5 is 0.1-mm square to 1-mm square.

Returning to FIG. 2(A), the individual membrane regions 41 are separated from one another by struts 45 that collectively form an orthogonal grid across the reticle 1. Each strut 45 typically is 0.5 mm to 1 mm thick (in the Z-direction) and approximately 0.1 mm wide (in the X- or Y-direction). The grid formed by the interconnecting struts 45 provides substantial rigidity and mechanical strength to the array of membrane regions 41 constituting the reticle 1. The skirts 43 typically are approximately 0.05 mm wide.

As shown in FIG. 2(A), linear groups of multiple membrane regions 41 are arrayed in the X-direction in the figure to form "deflection strips" 44. Multiple deflection strips 44 are arrayed in the Y-direction in the figure to form a "stripe" 49. The reticle 1 comprises multiple stripes 49 arrayed in the X-direction. The width of each stripe 49 (equal to the length of each deflection strip 44 in the stripe) corresponds to the deflection range of the illumination-optical system. The stripes 49 are separated from one another by large struts 47 that help minimize overall distortion of the reticle 1. The large struts 47 are contiguous with the smaller struts 45 and are each about 0.5 mm to 1 mm thick and several mm wide.

Although the reticle 1 shown in FIG. 2(A) has non-patterned regions (i.e., skirts 43 and struts 45) situated between each membrane region 41, certain embodiments of divided reticles lack non-patterned regions between the membrane regions 41 located within individual deflection strips 44 (as discussed below with respect to FIG. 5). Other reticles are possible that have no non-patterned regions over the entire pattern-defining region of the reticle.

Typically, the subfields 42 in a single deflection strip 44 are illuminated sequentially for exposure, wherein the sequential illumination is achieved by appropriately deflecting the illumination beam laterally (in the X-direction in FIG. 2(A)) in a continuously scanning manner. The deflection strips 44 in a stripe 49 are illuminated sequentially by appropriately moving the reticle stage 16 in a continuously scanning manner (in the Y-direction in FIG. 2(A)). To advance to the next stripe 49, the reticle stage 16 is moved intermittently ("stepped") as required.

During projection of the membrane regions 41, any intervening non-patterned regions such as skirts and struts are not imaged on the wafer 5. Meanwhile, the images of the membrane regions are placed contiguously on the wafer to achieve proper "stitching" of the images for forming "chips" on the wafer.

Figure 3:
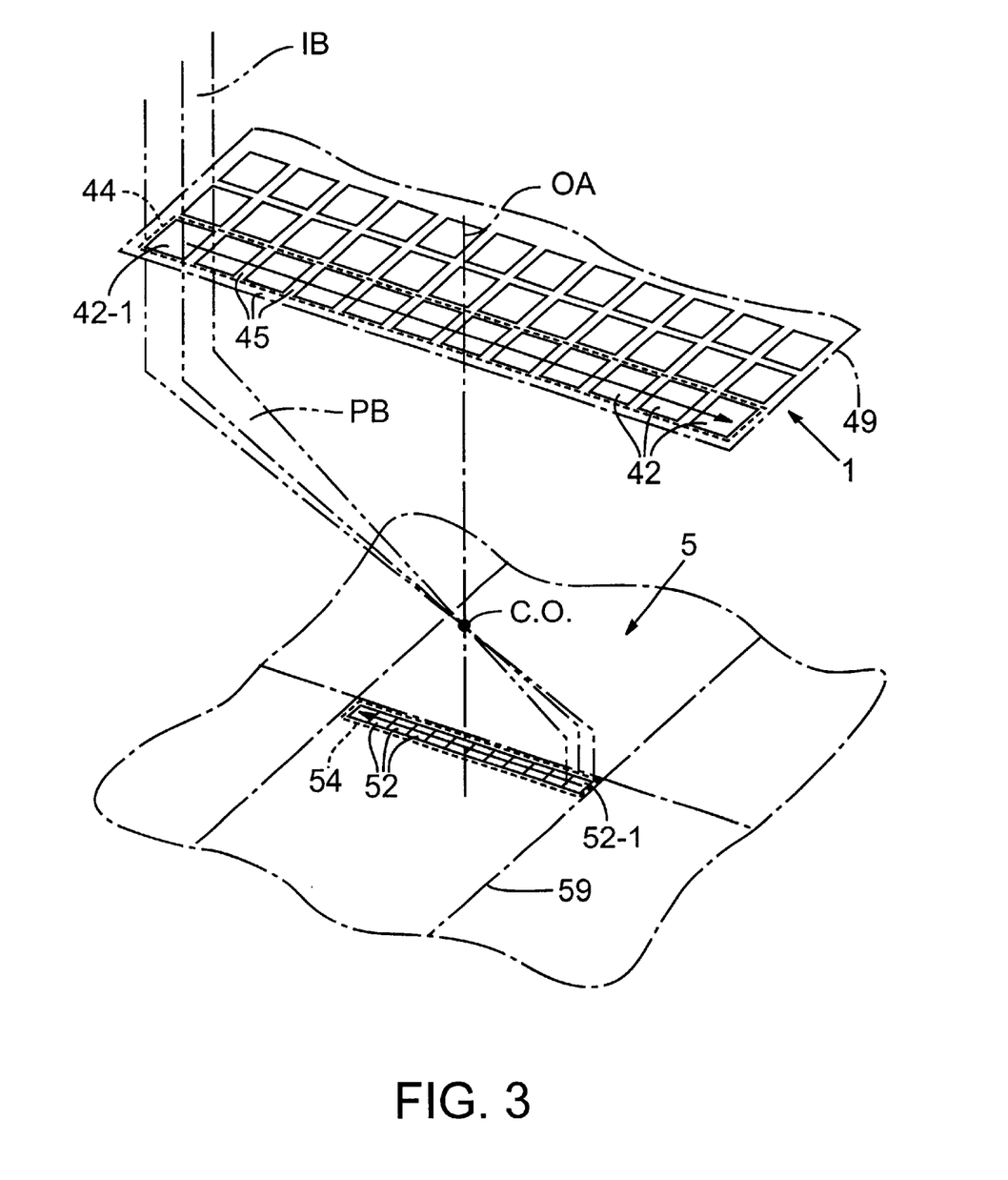
FIG. 3 is an oblique view schematically showing certain aspects of pattern transfer from a reticle to a wafer.

FIG. 3 shows certain aspects of a representative manner in which the subfields 42 are projected from the reticle 1 to the wafer 5. A portion of a stripe 49 on the reticle 1 is shown in the upper portion of the figure. The stripe 49 comprises multiple deflection strips 44 each containing a linear array of subfields 42 (skirts are not shown). In the depicted embodiment, struts 45 separate the subfields 42 from each other on the reticle 1. In the figure, the subfield 42-1 in the upper left corner of the stripe 49 is being illuminated from upstream by the illumination beam IB. The patterned beam PB that has passed through the subfield 42-1 passes through a crossover position C.O. The image carried by the patterned beam PB is demagnified and projected by the action of the projection lenses 14, 15 (not shown, but see FIG. 1) and deflector 13 (not shown, but see FIG. 1) onto a corresponding transfer subfield 52-1 on the wafer 5.

As can be seen, each deflection strip 44 on the reticle 1 is transferred to a corresponding strip 54 on the wafer 5. However, the transfer subfields 52 in the strip do not have intervening struts. I.e., the subfields 52 in the strip 54 are contiguous. Similarly, the multiple strips 54 in a transferred stripe 59 on the wafer 5 are contiguous with each other.

The respective transfer position, on the wafer 5, of each transfer subfield 52 is determined by appropriate energization of the deflector 13 situated between the reticle 1 and the wafer 5 to achieve proper stitching together of the transfer subfields 52. If the patterned beam PB propagating from a particular subfield 42 were focused merely on the wafer 5 by the projection lenses 14, 15, then the image of the entire subfield 42 (including struts 45 and skirt 43) would be transferred, at the specified demagnification ratio, to the wafer, producing unexposed regions on the wafer 5. To avoid this situation, the transfer position of each transfer subfield 52 on the wafer 5 is shifted (laterally in the X- and Y-directions) as required for proper stitching. The respective magnitudes of the shifts correspond to the respective widths of the individual non-patterned regions. Of course, if the membrane regions 41 in individual deflection strips 44 are not separated by struts 45 and skirts 43, then such lateral shifting in the X-direction is not necessary. Similarly, if the deflection strips 44 in individual stripes 49 are not separated by struts 45 and skirts 43, then such lateral shifting in the Y-direction is not necessary.

Typically, using a reticle as shown in FIG. 2(A), as exposure proceeds in the Y-direction, as described above, the reticle stage 16 is moved continuously at a velocity $V_M$ in the −Y-direction, and the wafer stage 21 is moved continuously at a velocity $V_W$ in the +Y-direction in synchrony with the continuous movement of the reticle stage 16. During exposure of each deflection strip 44, the Y-direction deflection range must not exceed a specified magnitude. I.e., the width of the deflection in the Y-direction is nearly equal to the width of a subfield. The deflection width is limited so as to satisfy the required minimization of aberration. To achieve such control, the start points and end points for each stripe 49 are synchronized with each other, with appropriate stage velocity as described in U.S. Pat. No. 5,879,842, incorporated herein by reference (see especially FIGS. 3(A) and 3(B) and columns 10–11 of the '842 patent). The relationship expressed by Equation (1) exists between the velocity $V_M$ of the reticle stage 16 and the velocity $V_W$ of the wafer stage 21:

$$V_M:V_W=M(L_1+L_2):L_1 \quad (1)$$

wherein 1/M is the demagnification ratio, $L_1$ is the Y-direction width of the patterned portion ("pattern field") of the subfield on the reticle, and $L_2$ is the Y-direction width of the non-patterned portion ("non-pattern field") of the subfield on the reticle.

The foregoing relationship is explained using a typical example. Assume that a 1 mm-wide pattern field is aligned in the Y-direction abutting a 0.3 mm-wide non-pattern field on the reticle. Also, assume the demagnification ratio is ⅕. In such a case, the respective image of each pattern field on the wafer has a width that is ⅕ the width of the pattern field on the reticle. In this example, the width of the pattern-field image is 0.20 mm on the wafer. The pattern-field images on the wafer abut one another without intervening images of non-pattern fields. To achieve such abutment, transfer is performed while moving the reticle stage and wafer stage continuously in opposite directions from each other at a velocity ratio of 5(1+0.3):1=6.5:1.

Since the stage-velocity ratio is thus shifted from 5:1 to 6.5:1, if the patterned beam were not deflected simultaneously in the Y-direction by the projection-optical system in a manner in which the increased stage-velocity ratio is taken into account, then the movement velocity of the reticle image would not match the movement velocity of the position on the wafer to which the image is being transferred. Hence, according to the invention, a compensating change to the scanning velocity of the patterned beam is made. If appropriate deflection of the patterned beam were not performed as exposure progresses, then, for example, when the first subfield of each deflection strip comes up for exposure, the image of that reticle subfield would be transferred to a "delayed" position on the wafer. I.e., in the absence of corrective deflection of the patterned beam, the wafer position for exposure would become increasingly "behind" its proper exposure position as transfer proceeds, thereby increasing the magnitude of lateral deflection of the patterned beam required to achieve proper stitching.

According to the invention, in order to reduce to zero the difference between the actual position of the wafer and/or reticle at time of imaging each subfield and the ideal position of the wafer and/or reticle for such imaging, the patterned beam is corrected by an appropriate deflection in the Y-direction. This correction is made by one or more of the deflectors in the projection-optical system to adjust the position of the image as formed on the wafer.

The basic concept of correcting errors in stage position is now explained. Assume that a reticle image is being projected onto the wafer surface at a demagnification ratio of 1/M. Let the actual reticle-stage position during an exposure ("shot") of a certain pattern subfield be $P_{M,actual}$ (as detected, e.g., by the interferometer 18), and the ideal reticle-stage position during the shot be $P_{M,\ ideal}$. The "error" is the difference between these positions:

$$\Delta P_M = P_{M,\ actual} - P_{M,\ ideal}. \quad (2)$$

Since the error at the reticle is "reduced" by 1/M by the projection lens, that error becomes $\Delta P_M/M$ at the wafer.

The actual position, ideal position, and error ($\Delta P_W$) at the wafer similarly are expressed as follows:

$$\Delta P_W = P_{W,actual} - P_{W,ideal}. \quad (3)$$

Both errors can be corrected using a single corrective deflector 35. However, the magnitude of correction as "seen" from the wafer side is $\Delta P_M/M + \Delta P_W$. Consequently, the magnitude of correction should be $-(\Delta P_M/M + \Delta P_W)$. Also, whenever there is a positional error of the wafer and reticle relative to each other, since the trajectory of the electron beam will be altered in an attempt to correct the error, deflection aberrations (e.g., distortions) also will be different compared to an exposure situation when the stages are at their respective ideal positions. A "deflection distortion" is a non-linearity error caused by beam deflection, i.e., a deviation of an actual position of a subfield relative to an ideal position of the subfield, as caused by deflection. This distortion is caused by deflectors in the illumination-optical system and in the projection-optical system, and can be corrected using an illumination deflector and a projection deflector as described herein. If the magnitude of deflection distortion caused by the deflector in the illumination-optical system is relatively small, then correction can be achieved using only a deflector in the projection-optical system (since the illumination beam can still irradiate an entire subfield). This can be said for both the reticle and the wafer. Therefore, the amount of distortion correction corresponding to positional errors of both the reticle and wafer is added and the following is output to the deflector 35 (corrections other than distortion are performed separately):

$$-(\Delta P_M/M + \Delta P_W) + P_{M,distortion} + P_{W,distortion}. \quad (4)$$

The +/− directionality will differ depending on how the coordinate axes are drawn on the reticle and wafer.

Hence, in this representative embodiment, the wafer-stage positional error and the reticle-stage positional error can be corrected by adjusting the pattern-transfer position on the exposure surface of the wafer using a single deflector.

Figure 4A:
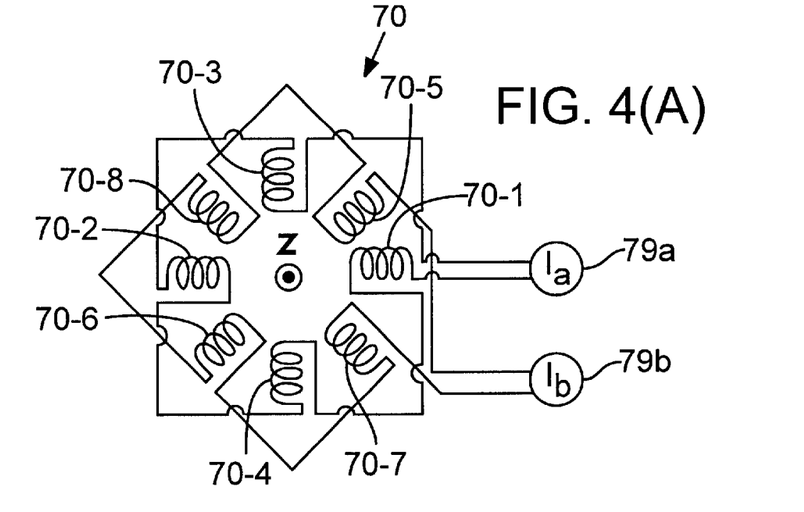
FIG. 4(A) is a schematic plan view of an astigmatism-corrector or stigmator that can be used in the FIG. 1 embodiment.
Figure 4B:
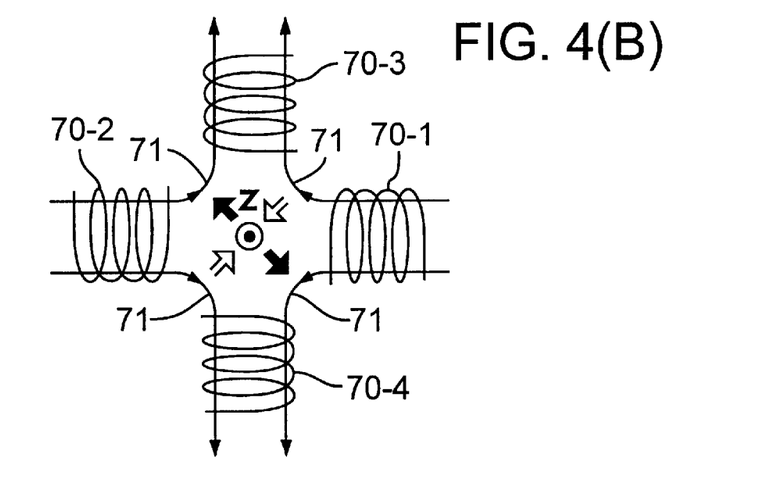
FIG. 4(B) is a schematic plan view showing operating principles of a set of quadrupole coils as used in the FIG. 4(A) corrector.
Figure 4C:
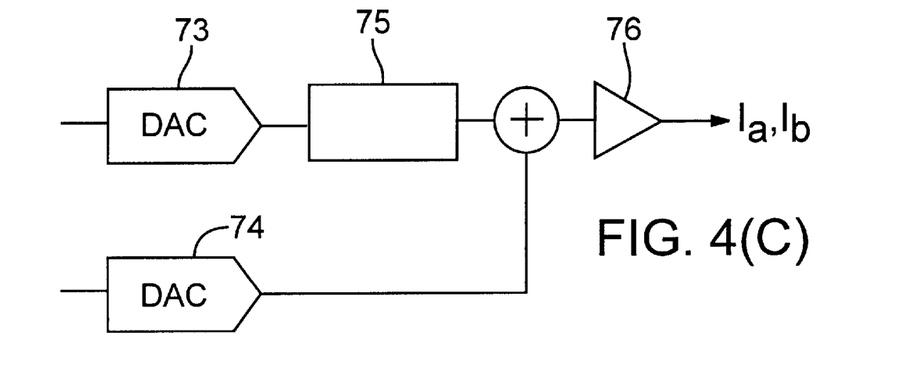
FIG. 4(C) is a circuit diagram of the power-supply circuit for the FIG. 4(A) deflector.

Next, a representative embodiment is described in which astigmatism in the respective subfield image is corrected in each shot. FIG. 4(A) is a schematic plan view of a representative astigmatism-corrector comprising two quadrupole coils. FIG. 4(b) is a schematic plan view showing the operating principle of a single quadrupole coil of the FIG. 4(A) corrector. FIG. 4(C) is a circuit diagram of a power supply circuit providing power to the coils of an astigmatism corrector as shown in FIGS. 4(A) and 4(B).

The astigmatism-corrector or stigmator 70 of FIG. 4(A) comprises two sets of quadrupole coils 70-1 to 70-8. Each coil 70-N is situated such that its respective axial core is oriented radially relative to the other coils around the optical axis (Z-axis). There is a 45° angle between each adjacent pair of coils 70-N.

The quadrupole coils 70-1 to 70-4 in the first set are connected together in series and driven by a respective power source 79a, and the quadrupole coils 70-5 to 70-8 in the second set are connected together in series and driven by a respective power source 79b. The first power source 79a energizes its respective coils independently of the second power source 79b.

The action of the astigmatism-corrector 70 is shown, in part, in FIG. 4(B), which depicts only the first set of quadrupole coils 70-1 to 70-4. In response to an electrical current ($I_a$) flowing serially through the coils 70-1 to 70-4, a magnetic flux 71 is generated as shown in the figure. Responsive to the magnetic flux, an electron beam propagating along the optical axis (extending perpendicular to the plane of the page from above to below) is subjected to deflection forces (thick dark arrows in the figure) tending to extend the beam transversely outward, away from the axis, in the directions of the thick dark arrows. The directions of the forces denoted by the thick dark arrows are in accordance with Fleming's left-hand rule. The electron beam also is subjected to deflection forces (thick hollow arrows) tending to urge the beam transversely toward the axis. As a result, a patterned beam passing through the astigmatism-corrector of FIG. 4(B) will be compressed in the directions denoted by the thick hollow arrows and expanded in the directions denoted by the thick dark arrows. As can be ascertained, the direction of each thick arrow is radially 90 degrees from the directions of the adjacent thick arrows. Thus, astigmatisms are eliminated in opposite-angle directions.

The second set of quadrupole coils 70-5 to 70-8 acts in a manner similar to that described above. The combined operation of the two sets of quadrupole coils achieves controlled correction of astigmatisms in various directions. Such control is achieved by controlling the respective orientation and magnitude of the electrical currents $I_a$, $I_b$ delivered by the power supplies 79a, 79b to the respective groups of quadrupole coils 70-1 to 70-4 and 70-5 to 70-8.

As referred to herein, changing a correction value for astigmatism during a shot means to change one or both electrical currents $I_a$, $I_b$ flowing, during the shot, through the respective sets of quadrupole coils 70-1 to 70-4 and 70-5 to 70-8. To such end, the power sources 79a, 79b can have any of various electrical configurations, as will be understood, that will allow the currents $I_a$, $I_b$ to be changed continuously as required during a shot. For example, referring to FIG. 4(C), a required amount of current change (a digital quantity) is converted to an analog signal by a digital-to-analog converter (DAC) 73. The analog signals are integrated by an analog integrator 75. The output of the analog integrator is added to a base analog signal (output from a second DAC 74) and amplified by an amplifier 76 for output to the sets of coils.

An example of a divided pattern (e.g., for a semiconductor device) as defined on a reticle used in another embodiment of a divided transfer exposure method according to the invention is now described with reference to FIG. 5. The vertical direction in FIG. 5 (i.e., the width dimension of the deflection strip 63) is the Y-direction, and the horizontal direction (i.e., the length dimension of the deflection strip 63) is the X-direction.

In this example, the entire pattern for a chip 61 is defined in a rectangular region on the reticle. The chip pattern 61 is divided into multiple deflection strips 63 that extend longitudinally in the X direction. Typical exemplary dimensions of a deflection strip 63 on the reticle are 1 mm wide and 20 to 40 mm long. In this embodiment, no struts exist inside any of the deflection strips 63. Several tens to several hundred deflection strips 63 are arrayed row-wise in the Y-direction to form a stripe 62. About three to seven stripes 62 extend in the X-direction to form the chip pattern 61.

Non-patterned regions 65 are disposed edgewise around the perimeter of each deflection strip 63. In an actual reticle, the center-line of each non-patterned region 65 is thicker (e.g., 1 mm thick) than inside the deflection strip 63; thus, the non-patterned regions 65 serve as reinforcing members to provide the reticle with sufficient rigidity to withstand actual use. The thickness of the reticle within the deflection strips 63 is, in contrast, about 2.0 $\mu$m for example. During use of the reticle for microlithographic exposure, the non-patterned regions 65 are not transferred to the wafer, and images of the respective pattern portions defined by the deflection strips 63 are stitched together on the wafer into a complete chip.

Figure 5:
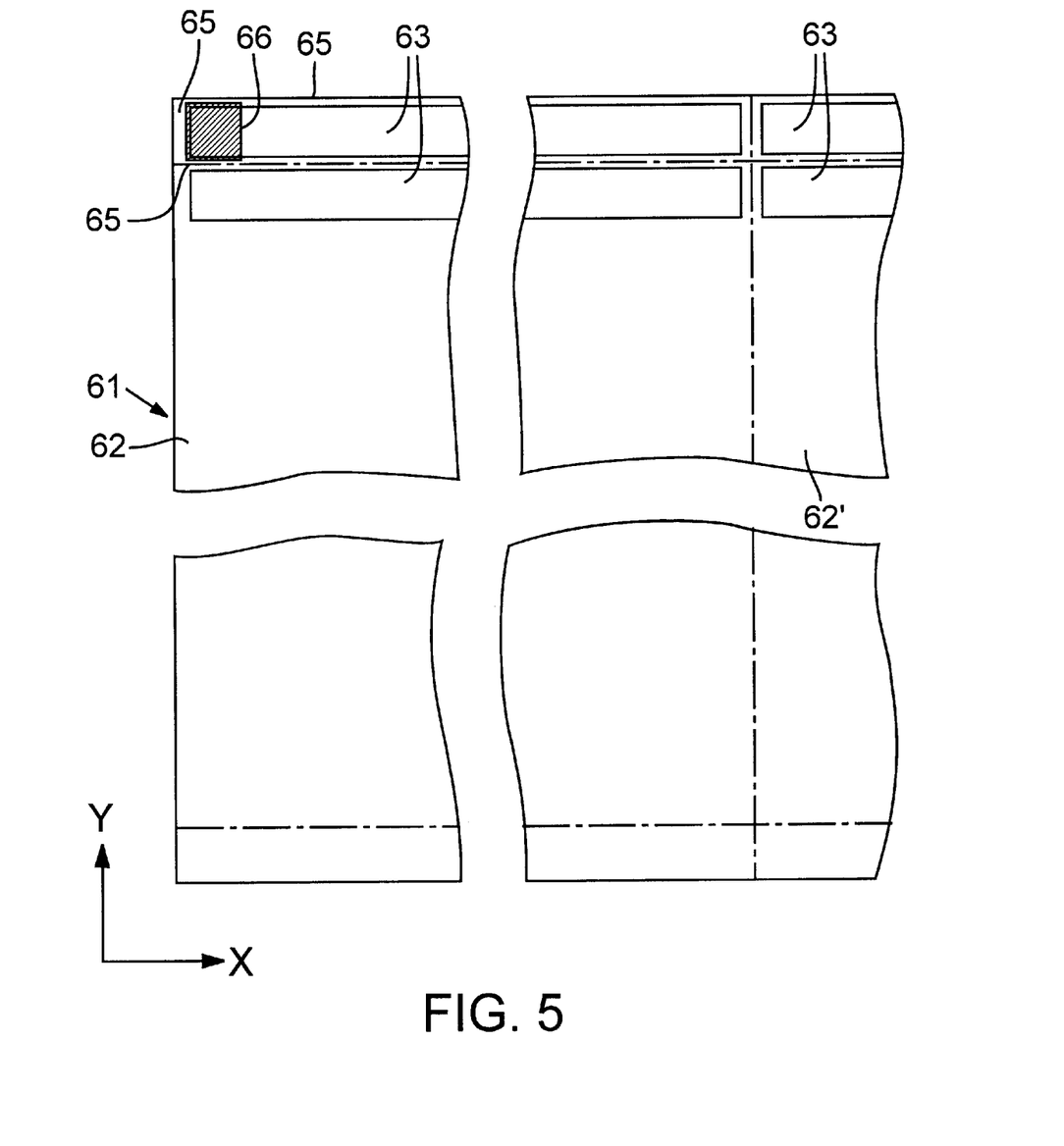
FIG. 5 is a schematic plan view showing certain aspects of an exemplary reticle for charged-particle-beam microlithography according to the invention.

When transferring the pattern of the chip 61 in FIG. 5, the reticle is illuminated by deflecting the illumination beam (carrying an image through the illumination-optical system of a beam-shaping aperture) appropriately in the X-direction. The deflection causes the illumination beam to move laterally within each deflection strip 63 in a scanning manner. Meanwhile the illumination beam has a rectangular transverse profile defining an "irradiation area" 66 having a Y-direction width that is slightly wider than the Y-direction width of the deflection strip 63 and an X-direction width that is smaller than the X-direction width of the deflection strip 63. The irradiation area 66 represents the area of the reticle illuminated by the illumination beam at a respective instant in time. The irradiation area can be smaller than a deflection strip 63 and can overlap one or more edges of the deflection strip 63. The patterned beam (produced by the transmitted portion of the illumination beam passing through the illuminated irradiation area) is demagnified and deflected by the projection-optical system. The projection-optical system directs the patterned beam to the appropriate location on the wafer in which the image of the respective pattern portion in the illuminated irradiation area is formed. As each deflection strip 63 is scanned, corrections can be imparted to the beam to achieve, e.g., dynamic focus correction so as to achieve low-aberration projection imaging.

As exposure proceeds to the next deflection strip 63, the reticle (as moved by the reticle stage) and wafer (as moved by the wafer stage) are moved continuously or intermittently, as required, in the Y-direction synchronously with each other. If the projection lenses are configured as an SMD, then the reticle stage and wafer stage are moved in opposite directions to each other due to inversion of the image as formed by the projection-optical system. During continuous stage movements, such as during exposure of a deflection strip 63, the deflection strip 63 on the reticle moves in the Y-direction as the respective position on the wafer (to which the deflection strip 63 is to be projected) also moves in the Y-direction, but in an opposite direction. Meanwhile, if the wafer-imaging position and the wafer-movement position are not synchronized with each other, then the illumination beam and the patterned beam are deflected sufficiently so that the beams impinge on the reticle and wafer, respectively, at the correct respective positions.

When exposure of one stripe 62 is completed and movement to the next adjacent stripe 62' is required, exposure is suspended temporarily. The reticle stage and wafer stage are stepped in the X-direction to place the initial irradiation area of the next stripe 62' on the reticle and the corresponding exposure position on the wafer at or near the optical axis.

If no non-patterned regions are inserted in the Y-direction in the pattern field of the reticle, then the velocity of the imaging position on the wafer basically can be made to match the velocity of the position on the wafer to which the image ideally should be transferred, as described above. In such a case, deflection-tracking in the Y-direction is not necessary. Typically, however, the extent to which the reticle stage and wafer stage are moved continuously during exposure, as well as the trajectory of the patterned beam vis-à-vis the projection-optical system will change during exposure. Changing the beam trajectory will be accompanied by a corresponding change in aberrations. These aberrations include positional distortion, defocusing, astigmatism, image rotation, image-magnification shift, and astigmatic image distortion, and can be corrected by various compensators. The astigmatism referred to here is an aberration in which the image focus differs with direction in the image plane. Astigmatic image distortion is an aberration in which the shape of the image differs depending on direction in the image plane.

Figure 6:
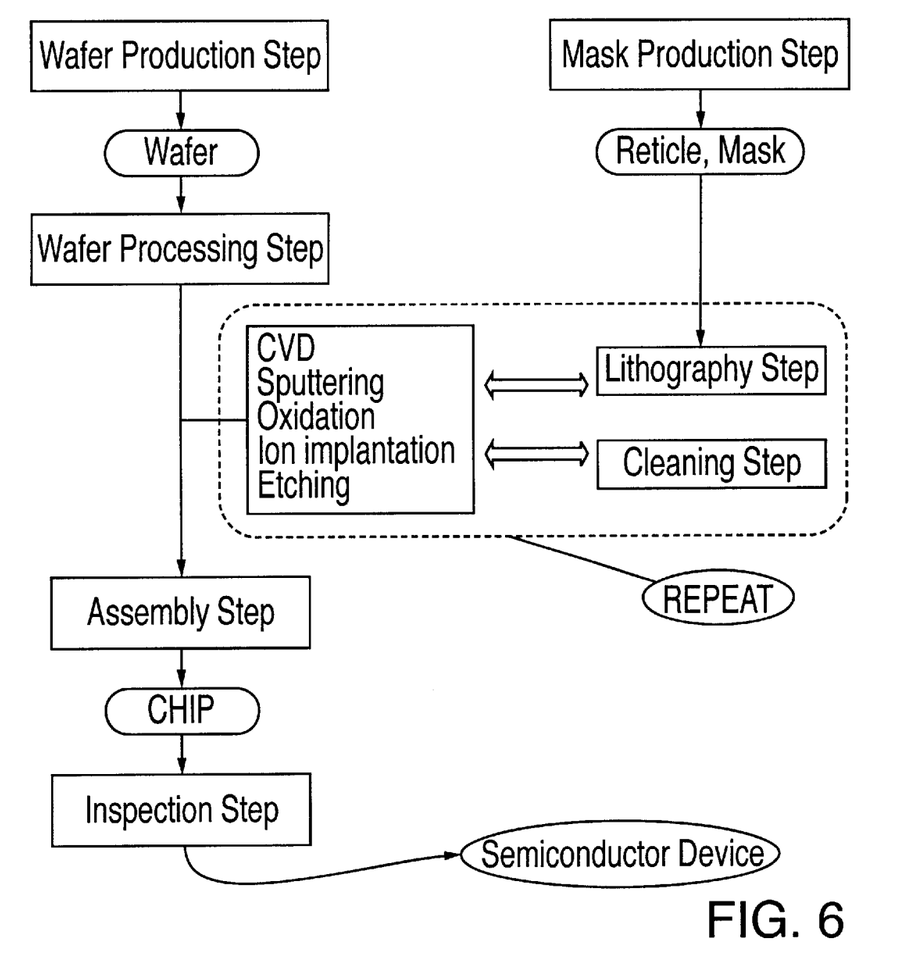
FIG. 6 is a process flowchart for manufacturing a semiconductor device, wherein the process includes a microlithography method according to the invention.

FIG. 6 is a flowchart of an exemplary semiconductor fabrication method to which apparatus and methods according to the invention readily can be applied. The fabrication method generally comprises the main steps of wafer production (wafer fabrication and preparation), reticle production (reticle fabrication and preparation), wafer processing, device (chip) assembly (including dicing, lead connections, and packaging), and device inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, wherein the formation of each layer typically involves multiple sub-steps. Usually, many operative semiconductor devices (e.g., memory chips or CPUs) are produced on each wafer.

Typical wafer-processing steps include: (1) thin-film layer formation involving formation of a dielectric layer for electrical insulation or a metal layer for forming interconnects and electrodes; (2) oxidation of the thin-film layer or wafer substrate; (3) microlithography to form a resist pattern, for selective processing of the thin film or the substrate itself, according to a reticle; (4) etching or analogous step to etch the thin film or substrate according to the resist pattern; (5) impurity doping or implantation (e.g., by ion bombardment or diffusion) as required to implant ions or impurities into the thin film or substrate according to the resist pattern; (6) resist stripping to remove the resist from the wafer; and (7) wafer inspection. Wafer processing is repeated as required (typically many times) to fabricate the desired semiconductor chips on the wafer.

Figure 7:
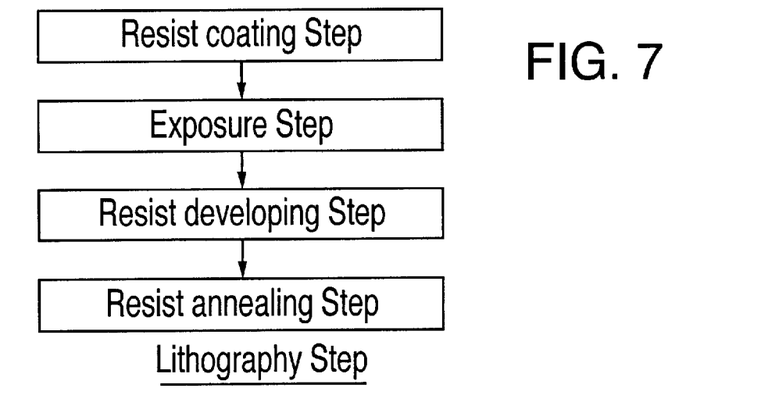
FIG. 7 is a process flowchart for performing a microlithography method that includes a projection-exposure method according to the invention.

FIG. 7 provides a flow chart of typical steps performed in microlithography, which is a principal step in wafer processing. The microlithography step typically includes: (1) resist-coating step, wherein a suitable resist is coated on the wafer or wafer substrate (which can include a circuit element formed in a previous wafer-processing step; (2) exposure step, to expose the resist with the desired pattern; (3) development step, to develop the exposed resist; and (4) optional resist-annealing step, to enhance the durability of the resist pattern.

As is apparent from the foregoing description, CPB microlithography apparatus and methods are provided, according to the invention, that achieve higher-accuracy pattern transfer.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A method for performing a microlithographic transfer of a pattern onto a sensitive exposure surface of a substrate, mounted on a movable substrate stage, using a charged particle beam, the method comprising:
   (a) exposing the substrate, mounted on the substrate stage, with multiple successive shots of a charged-particle patterned beam onto respective specific locations on the exposure surface while moving the substrate stage and deflecting the patterned beam to the respective specific locations, so as to imprint the exposure surface with the pattern;
   (b) while performing step (a), during the shots, applying respective amounts of deflection-aberration correction as the patterned beam is deflected to the respective specific locations; and
   (c) in a given shot in which deflection of the patterned beam has changed from a previous position, updating the amount of the correction so as to apply an appropriate deflection-aberration correction for the given shot.

2. The method of claim 1, wherein, in step (b), the amount of deflection-aberration correction applied in a shot corresponds to the respective specific location of the patterned beam.

3. The method of claim 1, wherein step (c) is performed by deflecting the patterned beam.

4. The method of claim 1, wherein the deflection-aberration correction is directed to an aberration selected from the group consisting of deflection-position distortion, defocusing, astigmatism, image rotation, image magnification shift, and image astigmatic distortion.

5. A method for performing a microlithographic transfer of a pattern, defined by a divided reticle, from the reticle to a sensitive exposure surface of a substrate using a charged particle beam, the method comprising:
   (a) deflecting a charged-particle illumination beam so as to direct the illumination beam to an irradiation area of the reticle so as to illuminate a respective pattern portion in the irradiation area;
   (b) projecting and deflecting a charged-particle patterned beam, comprising particles of the illumination beam that have passed through the irradiation area, to a respective location on the exposure surface so as to form an image at the location of the respective pattern portion illuminated in the irradiation area;
   (c) repeating steps (a) and (b) as required to perform, by multiple successive shots, transfer of images of respective pattern portions in respective irradiation areas to respective locations on the exposure surface so as to transfer the pattern to the exposure surface, the respective locations serving to stitch together the images of the respective pattern portions on the exposure surface;
   (d) during the shots applying respective amounts of deflection-aberration correction as the patterned beam is deflected to the respective specific locations; and
   (e) accompanying progression to a given shot, updating an amount of deflection-aberration correction so as to apply an appropriate deflection-aberration correction for the given shot.

6. The method of claim 5, wherein the deflection-aberration correction is directed to an aberration selected from the group consisting of deflection-position distortion, defocusing, astigmatism, image rotation, image magnification shift, and image astigmatic distortion.

7. A method for performing a microlithographic transfer of a pattern, defined by a divided reticle, from the reticle to a sensitive exposure surface of a substrate using a charged particle beam, the method comprising:

(a) mounting the substrate on a movable substrate stage and the reticle on a movable reticle stage;

(b) moving the reticle stage at a reticle-stage velocity and deflecting a charged-particle illumination beam to an irradiation area on the reticle so as to illuminate a respective pattern portion in the irradiation area;

(c) moving the substrate stage at a substrate-stage velocity and projecting a charged-particle patterned beam, comprising charged particles of the illumination beam that have passed through the irradiation area, to a respective location on the exposure surface so as to form at the location a demagnified image of the respective pattern portion illuminated in the irradiation area;

(d) repeating steps (b) and (c) as required to perform, by multiple successive shots, transfer of images of respective pattern portions in respective irradiation areas to respective locations on the exposure surface so as to stitch the images together and transfer the pattern to the exposure surface;

(e) if, during any of steps (b)–(d), a demagnification ratio of an image as projected onto a respective location on the exposure surface does not match a ratio of the substrate-stage velocity to the reticle-stage velocity, then causing the image to track movement of the respective location on the exposure surface by appropriately deflecting the patterned beam;

(f) during the shots, as the patterned beam is deflected, applying respective amounts of deflection-aberration correction to the patterned beam; and (g) accompanying progression to a given shot, if a required amount of deflection-aberration correction has changed, then updating the amount of correction so as to apply an appropriate deflection-aberration correction for the given shot.

8. The method of claim 7, wherein the deflection-aberration correction is directed to an aberration selected from the group consisting of deflection-position distortion, defocusing, astigmatism, image rotation, image magnification shift, and image astigmatic distortion.

9. A method for performing a microlithographic transfer of a pattern, defined by a divided reticle, from the reticle to a sensitive exposure surface of a substrate using a charged particle beam, the method comprising:

(a) mounting the substrate on a movable substrate stage and the reticle on a movable reticle stage;

(b) moving the reticle stage and directing a charged-particle illumination beam to an irradiation area on the reticle so as to illuminate a respective pattern portion in the irradiation area;

(c) moving the substrate stage and projecting a charged-particle patterned beam, comprising charged particles of the illumination beam that have passed through the irradiation area, to a respective location on the exposure surface so as to form at the location a demagnified image of the respective pattern portion illuminated in the irradiation area;

(d) repeating steps (b) and (c) as required to perform, by multiple successive shots, transfer of images of respective pattern portions in respective irradiation areas to respective locations on the exposure surface so as to stitch the images together and transfer the pattern to the exposure surface;

(e) imparting a deflection to the illumination beam as required to correct an error in irradiation position of the illumination beam on the reticle relative to an ideal position of the irradiation area on the reticle;

(f) imparting a deflection to the patterned beam as required to correct an error in the location of an image, as projected onto the exposure surface, of a respective pattern portion illuminated in the respective irradiation area, caused by a reticle-position error; and (g) correcting a deflection aberration as imparted to the at least one of the illumination beam and patterned beam resulting from imparting the respective deflections to the illumination beam and patterned beam, respectively.

10. The method of claim 9, wherein step (e) is performed using an illumination-beam deflector located upstream of the reticle.

11. The method of claim 10, wherein step (g) comprises correcting a deflection distortion arising from use of the illumination-beam deflector to deflect the illumination beam to correct a deviation of the reticle from an ideal reticle position.

12. The method of claim 9, wherein step (f) is performed using a patterned-beam deflector located between the reticle and the substrate.

13. The method of claim 12, wherein step (g) comprises correcting a deflection distortion arising from use of the patterned-beam deflector to deflect the patterned beam to correct a position error of the projected image on the exposure surface as caused by a reticle-position error.

14. The method of claim 12, wherein step (e) is performed using an illumination-beam deflector located upstream of the reticle.

15. The method of claim 14, wherein step (g) comprises correcting a deflection aberration arising from use of one or both of the illumination-beam deflector and the patterned-beam deflector.

16. The method of claim 15, wherein the deflection-aberration correction is directed to an aberration selected from the group consisting of deflection-position distortion, defocusing, astigmatism, image rotation, image magnification shift, and image astigmatic distortion.

17. A method for microlithographically transferring a pattern, defined by a reticle, from the reticle to a sensitive exposure surface of a substrate using a charged particle beam, the method comprising:

(a) defining the pattern on the reticle in a manner in which the pattern is divided into multiple respective pattern segments;

(b) mounting the substrate on a movable substrate stage and the reticle on a movable reticle stage;

(c) providing the charged particle illumination beam of a transverse-profile area smaller than a pattern segment;

(d) while moving the reticle stage, deflecting the illumination beam in a scanning manner onto an irradiation area of the reticle so as to illuminate a respective pattern portion in the irradiation area;

(e) while moving the substrate stage, projecting a charged-particle patterned beam, comprising charged particles of the illumination beam that have passed through the irradiation area, in a scanning manner to a respective location on the exposure surface so as to form at the location a demagnified image of the respective pattern portion illuminated in the irradiation area;

(f) repeating steps (d) and (e) as required to perform, by multiple successive shots made by scanning the illumination and patterned beams, transfer of images of respective pattern portions in respective irradiation areas to respective locations on the exposure surface so as to stitch the images together and transfer the pattern to the exposure surface;

(g) during the shots, applying respective amounts of deflection-aberration correction as the patterned beam is deflected to the respective specific locations; and (h) accompanying progression to a given shot, updating the amount of deflection-aberration correction as required so as to apply an appropriate deflection-aberration correction for the given shot.

18. The method of claim 17, wherein the deflection-aberration correction is directed to an aberration selected from the group consisting of deflection-position distortion, defocusing, astigmatism, image rotation, image magnification shift, and image astigmatic distortion.

19. A method for performing a microlithographic transfer of a pattern, defined by a divided reticle, from the reticle to a sensitive exposure surface of a substrate using a charged particle beam, the method comprising:

(a) mounting the substrate on a movable substrate stage and the reticle on a movable reticle stage;

(b) while moving the reticle stage, deflecting a charged-particle illumination beam to an irradiation area of the reticle so as to illuminate a respective pattern portion in the irradiation area;

(c) while moving the substrate stage, deflecting and projecting a charged-particle patterned beam, comprising charged particles of the illumination beam that have passed through the irradiation area, to a respective location on the exposure surface so as to form at the location a demagnified image of the respective pattern portion illuminated in the irradiation area;

(d) repeating steps (b) and (c) as required to perform, by multiple successive shots, transfer of images of respective pattern portions to respective locations on the exposure surface so as to stitch the images together and transfer the pattern to the exposure surface;

(e) during a shot, deflecting the patterned beam in a manner by which the image of the illuminated irradiation field tracks movement of the respective location on the exposure surface;

(f) in one or more shots, applying an amount of deflection-aberration correction as the patterned beam is deflected to the respective specific locations;

(g) accompanying progression to a given shot, updating the amount of deflection-aberration correction as required so as to apply an appropriate deflection-aberration correction for the given shot; and (h) for the given shot, if a position of the reticle is not an ideal reticle position and a corresponding position of the substrate is not an ideal substrate position, further deflecting the patterned beam to apply respective corrections to the reticle position and substrate position and to correct any deflection distortions of the patterned beam, so as to form the respective image at an ideal location on the exposure surface.

20. The method of claim 19, wherein step (h) is performed using a deflector situated between the reticle and the substrate.

21. The method of claim 19, wherein the deflection-aberration correction is directed to an aberration selected from the group consisting of deflection-position distortion, defocusing, astigmatism, image rotation, image magnification shift, and image astigmatic distortion.

22. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 1.

23. A semiconductor device produced by the method of claim 22.

24. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 5.

25. A semiconductor device produced by the method of claim 24.

26. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 7.

27. A semiconductor device produced by the method of claim 26.

28. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 9.

29. A semiconductor device produced by the method of claim 28.

30. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 17.

31. A semiconductor device produced by the method of claim 30.

32. A semiconductor-fabrication process, comprising the steps of:

(a) preparing a wafer;

(b) processing the wafer; and (c) assembling devices formed on the wafer during steps (a) and (b), wherein step (b) comprises a method for performing a microlithographic transfer as recited in claim 19.

33. A semiconductor device produced by the method of claim 32.

* * * * *

UNITED STATES PATENT AND TRADEMARK OFFICE
CERTIFICATE OF CORRECTION

PATENT NO.    : 6,541,169 B1
DATED         : April 1, 2003
INVENTOR(S)   : Okino et al.

It is certified that error appears in the above-identified patent and that said Letters Patent is hereby corrected as shown below:

Column 16,
Line 15, "$\Delta P_M = P_{M,\ actual}{}^{31} P_{M,\ ideal.}$" should be -- $\Delta P_M = P_{M,\ actual} - P_{M,\ ideal.}$ --.

Signed and Sealed this

Thirtieth Day of December, 2003

JAMES E. ROGAN
*Director of the United States Patent and Trademark Office*